US011127807B2

(12) United States Patent
Kim et al.

(10) Patent No.: US 11,127,807 B2
(45) Date of Patent: Sep. 21, 2021

(54) DISPLAY DEVICE AND MANUFACTURING METHOD THEREOF

(71) Applicants: Samsung Display Co., Ltd., Yongin-Si (KR); POSTECH ACADEMY-INDUSTRY FOUNDATION, Pohang-si (KR)

(72) Inventors: Sang Gab Kim, Seoul (KR); Hyun Min Cho, Hwaseong-si (KR); Tae Sung Kim, Incheon (KR); Yu-Gwang Jeong, Anyang-si (KR); Su Bin Bae, Hwaseong-si (KR); Jin Seock Kim, Seongnam-si (KR); Sang Gyun Kim, Hwaseong-si (KR); Hyo Min Ko, Suwon-si (KR); Kil Won Cho, Pohang-si (KR); Hansol Lee, Incheon (KR)

(73) Assignee: Samsung Display Co., Ltd.

( * ) Notice: Subject to any disclaimer, the term of this patent is extended or adjusted under 35 U.S.C. 154(b) by 6 days.

(21) Appl. No.: 16/521,394

(22) Filed: Jul. 24, 2019

(65) Prior Publication Data
US 2020/0058727 A1 Feb. 20, 2020

(30) Foreign Application Priority Data

Aug. 20, 2018 (KR) .................. 10-2018-0096854

(51) Int. Cl.
*H01L 27/32* (2006.01)
*H01L 51/56* (2006.01)

(52) U.S. Cl.
CPC .......... *H01L 27/3276* (2013.01); *H01L 51/56* (2013.01); *H01L 2227/323* (2013.01); *H01L 2251/5392* (2013.01)

(58) Field of Classification Search
CPC ............... H01L 27/3276; H01L 51/56; H01L 2251/5392; H01L 2227/323; H01L 51/5206; H01L 51/5203
See application file for complete search history.

(56) References Cited

U.S. PATENT DOCUMENTS 4,297,436 A 10/1981 Kubotera et al.
5,061,595 A 10/1991 Gingello et al.
(Continued)

FOREIGN PATENT DOCUMENTS

EP 2105769 A1 9/2009
JP 4928561 B2 5/2012
(Continued)

OTHER PUBLICATIONS

S.D. Park et al., "Etch characteristics of silver by inductively coupled fluorine-based plasmas," Thin Solid Films 445, 2003, pp. 138-143.

(Continued)

*Primary Examiner* — Edward Chin
(74) *Attorney, Agent, or Firm* — Innovation Counsel LLP

(57) ABSTRACT

An manufacturing method of a display device may include the following steps: forming a transistor on a substrate; forming an insulating layer on the transistor; forming a conductive layer including silver on the insulating layer; forming a photosensitive member on the conductive layer; forming an electrode of a light-emitting element by etching the conductive layer; performing plasma treatment on a structure that comprises the electrode, the plasma treatment using a gas including a halogen; and removing a product that is resulted from the plasma treatment.

13 Claims, 15 Drawing Sheets

(56) References Cited

U.S. PATENT DOCUMENTS

| | | |
|---|---|---|
| 5,175,073 A | 12/1992 | Gingello et al. |
| 5,213,954 A | 5/1993 | Shor et al. |
| 5,955,141 A | 9/1999 | Soutar et al. |
| 6,319,543 B1 | 11/2001 | Soutar et al. |
| 7,521,369 B2 | 4/2009 | Shamiryan et al. |
| 7,754,417 B2 | 7/2010 | Dutton |
| 7,824,499 B2 | 11/2010 | Dictus |
| 8,313,891 B2 | 11/2012 | Dutton |
| RE45,175 E | 10/2014 | Soutar et al. |
| RE45,279 E | 12/2014 | Soutar et al. |
| 2008/0315428 A1* | 12/2008 | Fujii .................. H01L 27/1285 257/773 |
| 2010/0134705 A1 | 6/2010 | Jabri et al. |
| 2013/0037807 A1* | 2/2013 | Fukaya .................. H01L 29/45 257/57 |
| 2013/0140063 A1 | 6/2013 | Dutton |
| 2014/0224427 A1* | 8/2014 | Takahashi ......... H01J 37/32082 156/345.51 |
| 2017/0278867 A1 | 9/2017 | Jeong et al. |
| 2018/0061895 A1 | 3/2018 | Kim et al. |
| 2018/0330493 A1* | 11/2018 | Milligan .............. G06N 3/0409 |
| 2020/0258968 A1* | 8/2020 | Tanaka .............. H01L 29/78648 |

FOREIGN PATENT DOCUMENTS

| | | |
|---|---|---|
| KR | 10-2005-0111168 A | 11/2005 |
| KR | 10-2018-0025382 A | 3/2018 |

OTHER PUBLICATIONS

Phucanh Nguyen et al., "Novel technique to pattern silver using CF4 and CF4/O2 glow discharges," Journal of Vacuum Science & Technology B, 2001, pp. 158-165, vol. 19, No. 1, American Institute of Physics.

Young-Joon Lee et al., "Characteristics of Ag Etching using Inductively Coupled Cl2-based plasmas," Jpn. J. Appl. Phys., 2003, pp. 286-290, vol. 42, Part 1, No. 1.

* cited by examiner

DISPLAY DEVICE AND MANUFACTURING METHOD THEREOF

CROSS-REFERENCE TO RELATED APPLICATION

This application claims priority to and the benefit of Korean Patent Application No. 10-2018-0096854 filed in the Korean Intellectual Property Office on Aug. 20, 2018; the entire contents of the Korean Patent Application are incorporated herein by reference.

BACKGROUND

(a) Technical Field

This technical field relates to a display device and a manufacturing method of the display device.

(b) Description of the Related Art

A display device includes a display panel including pixels for displaying an image. In the display panel of an organic light emitting diode display, a pixel may include an organic light emitting diode including a cathode, an anode, and an organic light emitting layer disposed between the cathode and the anode. Electrons injected from the cathode and holes injected from the anode are combined with each other in the organic light emitting layer to generate excitons, and energy is outputted from the excitons to emit light. The organic light emitting diode display can display an image by controlling luminance of each pixel, which corresponds to a light emitting amount of each organic light emitting diode.

The above information disclosed in this Background section is for enhancement of understanding of the background of this application. The Background section may contain information that does not form the prior art that is already known in this country to a person of ordinary skill in the art.

SUMMARY

Embodiments may be related to a method for reducing unwanted metal particles that may occur in a manufacturing process of a display device.

An embodiment may be related to a manufacturing method of a display device. The method may include the following steps: forming a transistor on a substrate; forming an insulating layer on the transistor; forming a conductive layer including silver on the insulating layer; forming a photosensitive member on the conductive layer; forming an electrode of a light-emitting element by etching the conductive layer; performing plasma treatment on a structure that comprises the electrode, the plasma treatment using a gas including a halogen; and removing a product that is resulted from the plasma treatment.

The product may be a silver halide.

The silver halide may be a silver fluoride.

The plasma treatment may be performed using a gas including fluorine.

The gas may include at least one of $CF_4$, $C_3F_6$, $C_4F_8$, $SF_6$, $NF_3$, $CHF_3$, $C_5F_8$, $CHF_3$, $CH_2F_2$, $C_2HF_5$, and $CH_3F$.

The plasma treatment may be performed using a gas including $CF_4$.

The plasma treatment may be performed using a gas including $N_2$.

The plasma treatment may be performed using a gas including $O_2$.

The plasma treatment may include at least one of plasma etching, reactive ion etching, and inductively coupled plasma treatment.

The plasma treatment may be performed by inductively coupled plasma.

The plasma treatment may be performed before removing the photosensitive member.

The method may include removing the photosensitive member using a stripper in a process step after the plasma treatment. The product may be removed in the process step.

The product may be removed using a cleaning liquid.

The method may include forming an electrically conductive pad on the substrate when the transistor is formed. After the removing of the product, a surface of the pad may include a metal fluoride.

An embodiment may be related to a display device. The display device may include the following elements: a substrate; a light-emitting element disposed on the substrate; and an electrically conductive pad disposed on the substrate and spaced from the light-emitting element. A surface of the pad may include a metal fluoride.

The surface of the pad may include a metal nitride.

The surface of the pad may include a metal oxide.

The metal fluoride may include titanium.

The pad may include a first electrical conductor and a second electrical conductor electrically connected to the first electrical conductor. The second electrical conductor may be positioned between the metal fluoride and the first electrical conductor.

The display device may include a transistor disposed on the substrate and including a transistor electrode. The light-emitting element may include a first electrode electrically connected to the transistor electrode, a second electrode overlapping the first electrode, and an emission layer positioned between the first electrode and the second electrode. A material of the second electrical conductor may be identical to a material of the transistor electrode.

According to embodiments, it is possible to reduce or effectively remove unwanted metal particles, particularly silver particles, generated in a manufacturing process of a display device, thereby reducing defects in the display device and improving reliability of the display device.

DETAILED DESCRIPTION

Figure 1:
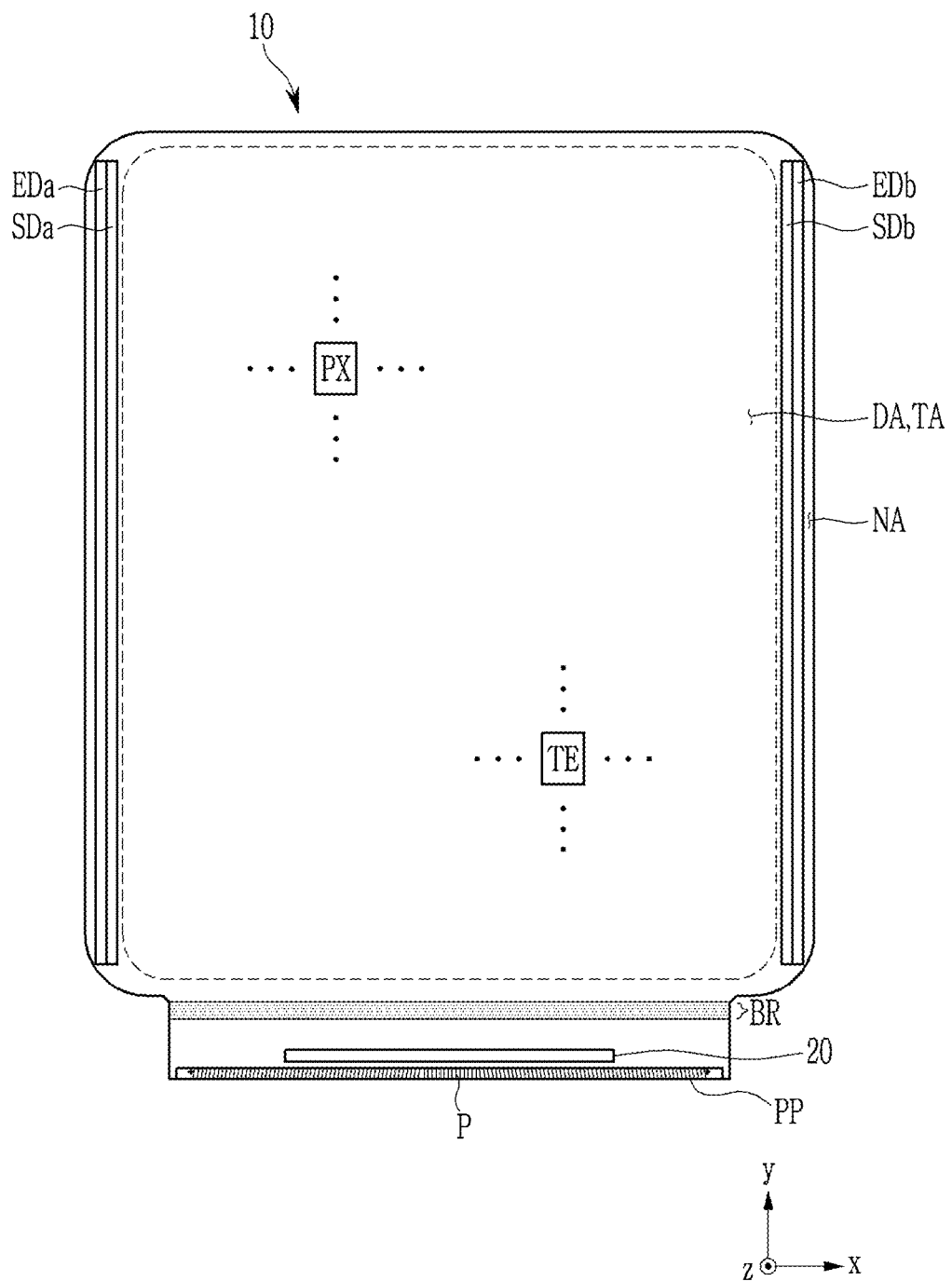
FIG. 1 illustrates a top plan view of a display device according to an embodiment.

Example embodiments are described with reference to the accompanying drawings. The described embodiments may be modified in various ways.

Like reference numerals may designate like elements.

In the drawings, sizes and thicknesses may be exaggerated for clarity.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on" a second element, the first element can be directly on the second element, or one or more intervening elements may be present between the first element and the second element. When a first element is referred to as being "directly on" a second element, there are no intended intervening elements (except environmental elements such as air) present between the first element and the second element.

FIG. 1 illustrates a top plan view of a display device according to an embodiment.

Referring to FIG. 1, the display device includes a display panel 10 and a driving unit including an integrated circuit chip 20.

The display panel 10 includes a display area DA corresponding to a screen on which an image is displayed, and a non-display area NA in which circuits and/or signal lines for generating and/or transmitting various signals applied to the display area DA are disposed and that is formed around the display area DA. In FIG. 1, the inside and outside of a dotted rectangle with rounded corners correspond to the display area DA and the non-display area NA, respectively.

In the display area DA of the display panel 10, pixels PX are disposed, for example, in a matrix. Signal lines such as scan lines (which are also referred to as gate lines), light emission control lines, data lines, and driving voltage lines are also disposed in the display area DA. The scan lines, the light emission control lines, the data lines, and the driving voltage lines are connected to the pixels PX, such that each pixel PX may receive a scan signal (which is also referred to as a gate signal), a light emission control signal, and a driving voltage ELVDD from the signal lines.

The display panel 10 may include a touch area TA capable of sensing a touch. The touch area TA may substantially coincide with the display area DA. In the touch area TA, touch electrodes TE are disposed, for example, in a matrix. The touch electrodes TE may sense a user's touch or non-contact touch. The display panel 10 having a touch sensing function may be referred to as a touch panel or a touch screen panel.

A pad portion PP including pads P for receiving signals from an external device (outside of the display panel 10) is disposed in the non-display area NA of the display panel 10. The pad portion PP may extend in a first direction x along one edge of the display panel 10. A flexible printed circuit film for transmitting signals from the external device (outside of the display panel 10) may be bonded to the pad portion PP. The first direction x is perpendicular to each of a second direction y and a third direction z (the thickness direction).

In the non-display area NA of the display panel 10, a driving unit for generating and/or processing various signals for driving the display panel 10 is disposed. The driving unit may include a data driver for applying data signals to the data lines, scan drivers SDa and SDb for applying scan signal to the scan lines, light emission drivers EDa and EDb for applying light emission control signals to the light emission control lines, and a signal controller for controlling the data driver, the scan drivers SDa and SDb, and the light emission drivers EDa and EDb.

The scan drivers SDa and SDb and the light emission drivers EDa and EDb are integrated in the display panel 10. The scan drivers SDa and SDb may be disposed at left and right sides of the display area DA. The emission drivers EDa and EDb may also be disposed at the left and right sides of the display area DA. The scan drivers SDa and SDb and/or the light emission drivers EDa and EDb may be disposed only at one of the left and right sides of the display area DA, and may be disposed at an upper or lower side of the display area DA.

The data driver and the signal controller may be provided as the integrated circuit chip 20 (also referred to as a driving IC chip), and the integrated circuit chip 20 may be mounted on the non-display area NA of the display panel 10. The integrated circuit chip 20 may be mounted on the flexible printed circuit film to be electrically connected to the display panel 10.

The display panel 10 may include a bending region BR. For example, the bending region BR may be disposed in the non-display area NA between the display area DA and the pad portion PP. The bending region BR may be disposed across the display panel 10 in the first direction x. The display panel 10 may be bent in the bending region BR such that the pad portion PP farther from the display area DA than the bending region BR may be disposed behind the display area DA.

Figure 2:
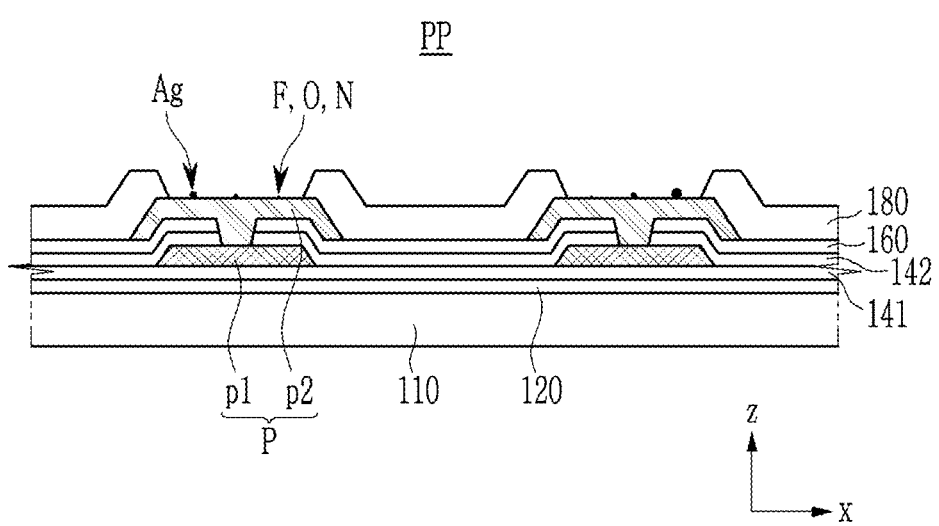
FIG. 2 illustrates a cross-sectional view of a pad portion according to an embodiment.
Figure 3:
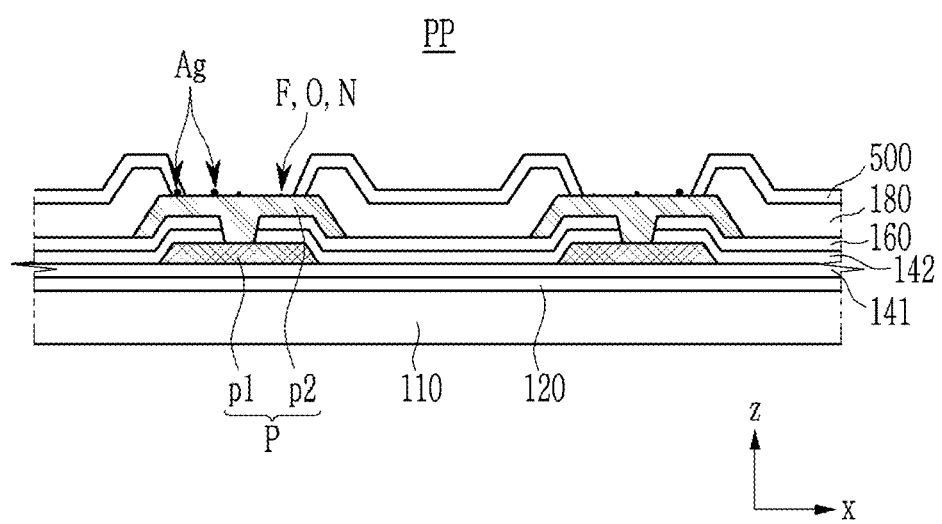
FIG. 3 illustrates a cross-sectional view of a pad portion according to an embodiment.

FIG. 2 and FIG. 3 each illustrate a cross-sectional view of a pad portion PP according to an embodiment. The pad portion PP includes a plurality of (electrically conductive) pads P, but only two pads P are shown in each of FIG. 2 and FIG. 3.

Referring to FIG. 2, the pad portion PP includes the pad P including a first (electrical) conductor p1 and a second (electrical) conductor p2 disposed on a substrate 110. A buffer layer 120 and a first insulating layer 141 may be disposed between the substrate 110 and the first conductor p1, and a second insulating layer 142 and a third insulating layer 160 may be disposed between the first conductor p1 and the second conductor p2. The second conductor p2 is connected to the first conductor p1 through a contact hole formed in the second insulating layer 142 and the third insulating layer 160. A fourth insulating layer 180 for exposing a least a part of an upper surface of the second conductor p2 may be disposed on the third insulating layer 160. In an embodiment, the first conductor p1 may be disposed between the second insulating layer 142 and the third insulating layer 160, and the second conductor p2 may be connected to the first conductor p1 through a contact hole formed in the third insulating layer 160. The pad P may further include a conductor disposed on the second conductor p2. Portions of the fourth insulating layer 180 around the pad P may be removed such that a lateral surface of the second conductor p2 may be exposed.

The first conductor p1 may electrically connect the pad P to one or more wires disposed in the non-display area NA. The first conductor p1 may not be connected to wires, such that the pad P may be called a dummy pad, an island pad, a floating pad, or the like. The upper surface of the second conductor p2 is electrically connected a pad or bump of an electronic component such as the flexible printed circuit film, for example, through a conductive particle or solder.

Silver particles may be disposed on the second conductor p2. The exposed surface of the second conductor p2 may contain fluorine (F), oxygen (O), and/or nitrogen (N). The fluorine, oxygen, and/or nitrogen present on the surface of the second conductor p2 may be measured by, for example, one or more of time-of-flight secondary ion mass spectrometry (TOF_SIMS), X-ray photoelectron spectroscopy (XPS), energy dispersive X-ray spectroscopy (EDX), electron spectrometry for chemical analysis (ESCA), etc. Fluorine, oxygen, and/or nitrogen may be present in a form of being bonded to a metal contained in the second conductor p2. For example, the surface of the second conductor p2 may include a metal fluoride, a metal oxide, and/or a metal nitride. The second conductor p2 may include a metal (or metal conductor) such as aluminum (Al), copper (Cu), silver (Ag), molybdenum (Mo), chromium (Cr), gold (Au), platinum (Pt), palladium (Pd), tantalum (Ta), tungsten (W), titanium (Ti), or nickel (Ni). The second conductor p2 may have a multilayer structure, and the uppermost layer may be made of titanium. In an embodiment, the surface of the second conductor p2 may include a titanium fluoride, a titanium oxide, and/or a titanium nitride.

Referring to FIG. 3, a fifth insulating layer 500 is disposed on the fourth insulating layer 180. The fifth insulating layer 500 may be formed because touch electrodes are deposited/formed on the display panel 10. The fifth insulating layer 500 may be made of an inorganic insulating material such as a silicon nitride (SiNx) and a silicon oxide (SiOx), or an organic insulating material. In an embodiment, the silver particles may be present between (a metal conductor of) the second conductor p2 and the fifth insulating layer 500. The surface of the second conductor p2 may include fluorine, oxygen, and/or nitrogen, and may include, for example, metal fluorides, metal oxides, and/or metal nitrides.

The metal fluoride, the metal oxide, and/or the metal nitride may be formed in a manufacturing process of the display panel 10.

Figure 4:
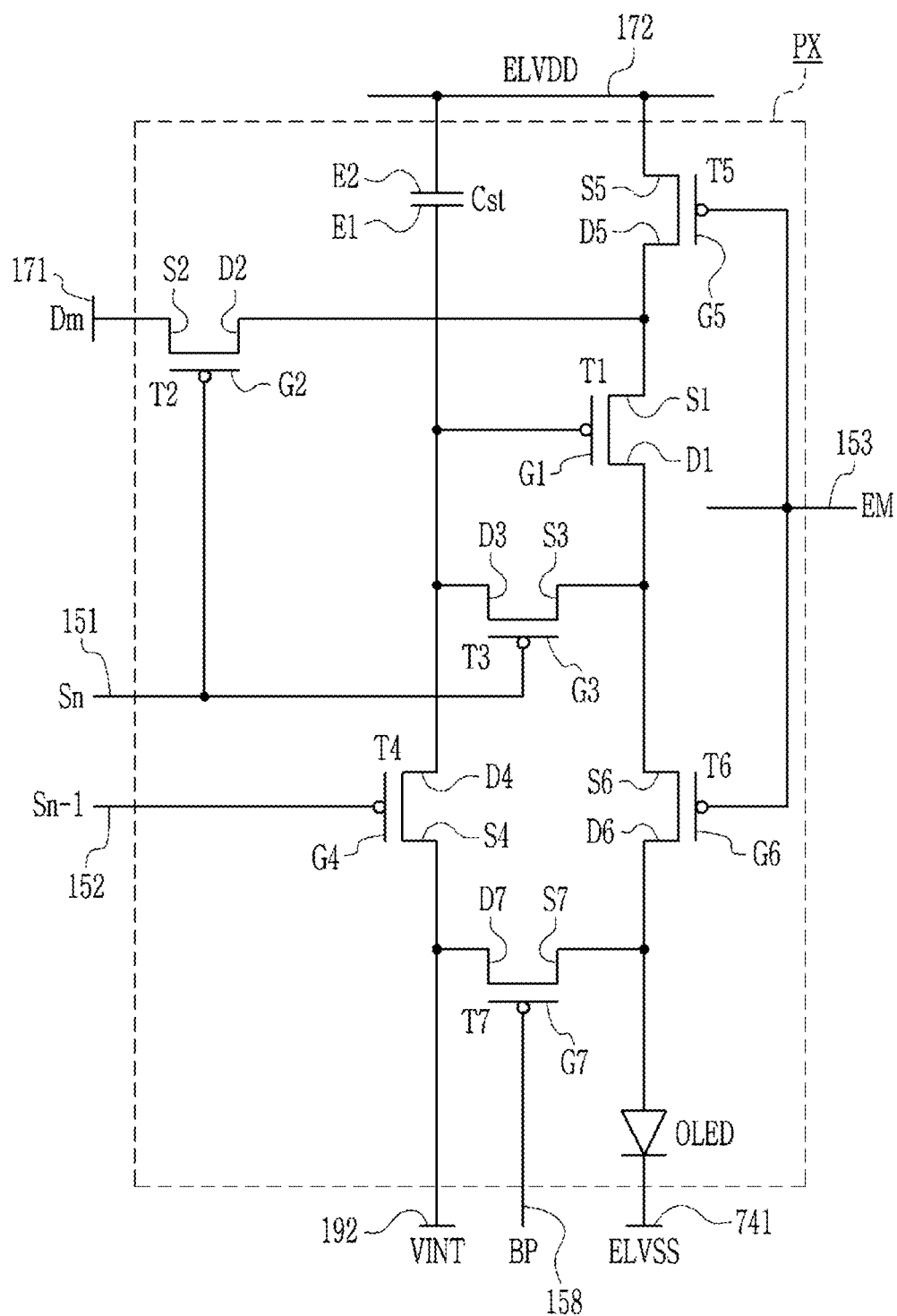
FIG. 4 illustrates an equivalent circuit diagram of one pixel of a display device according to an embodiment.
Figure 5:
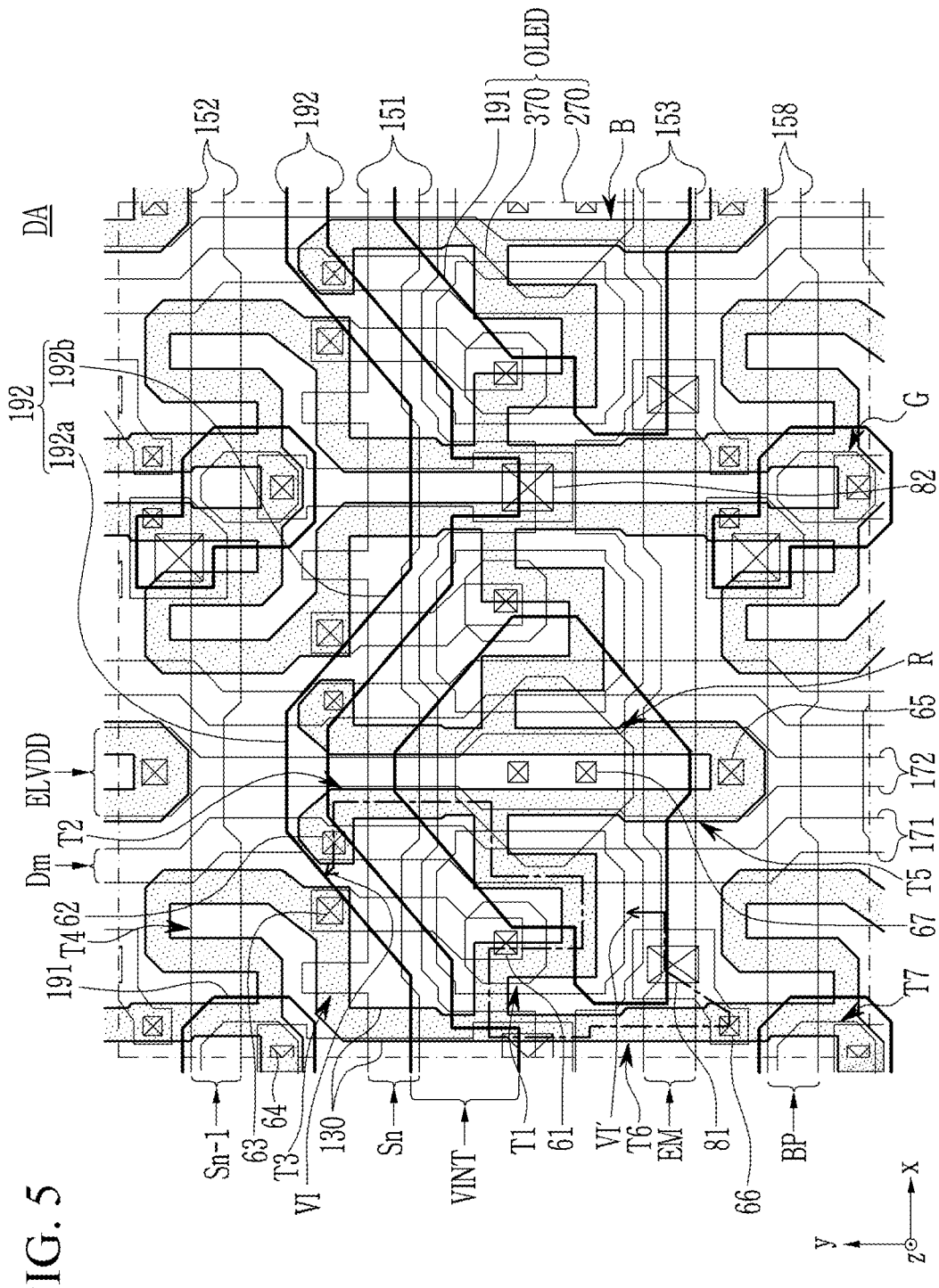
FIG. 5 illustrates a layout view of pixels of a display device according to an embodiment.
Figure 6:
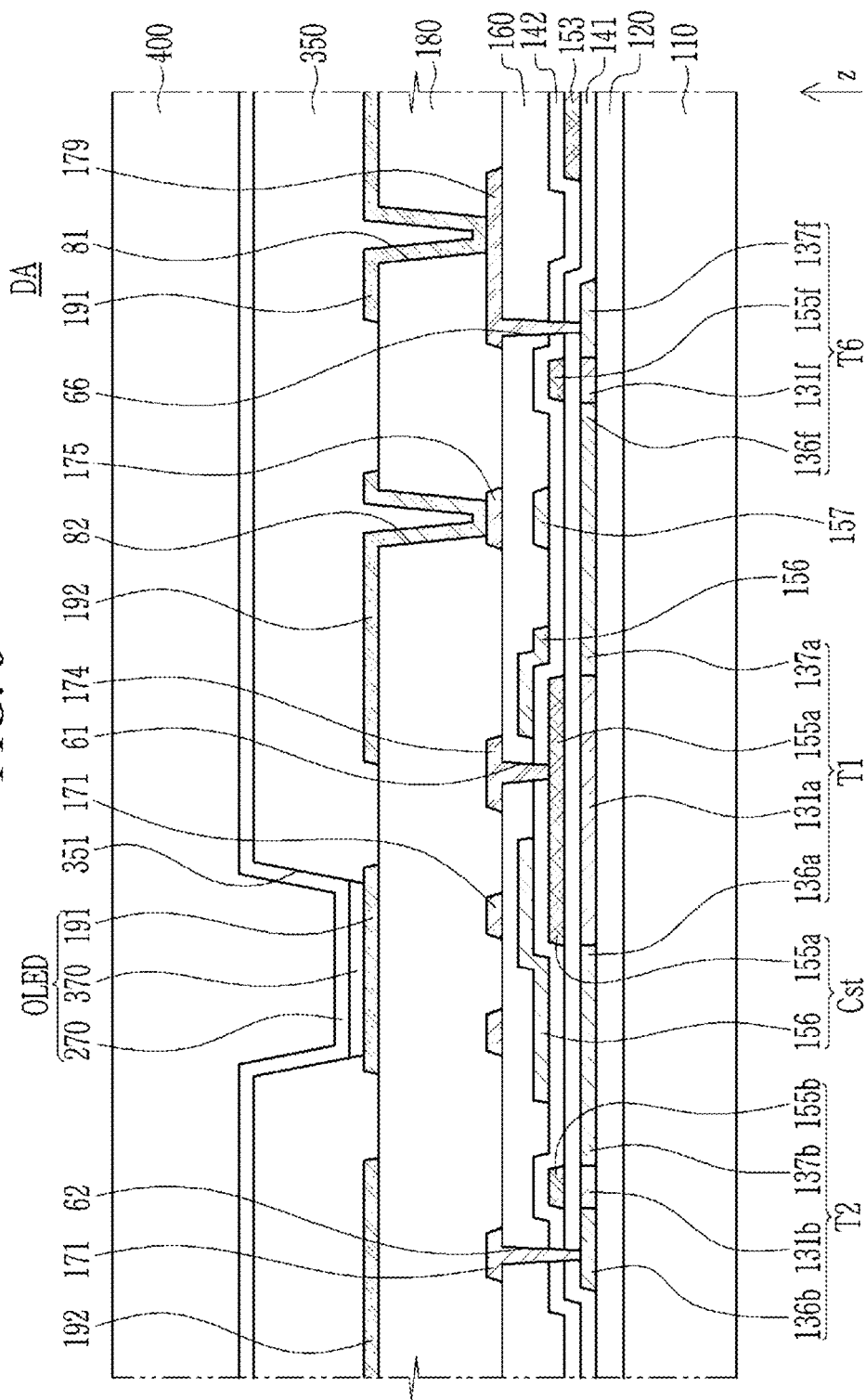
FIG. 6 illustrates a cross-sectional view taken along line VI-VI' indicated in FIG. 5 according to an embodiment.
Figure 7:
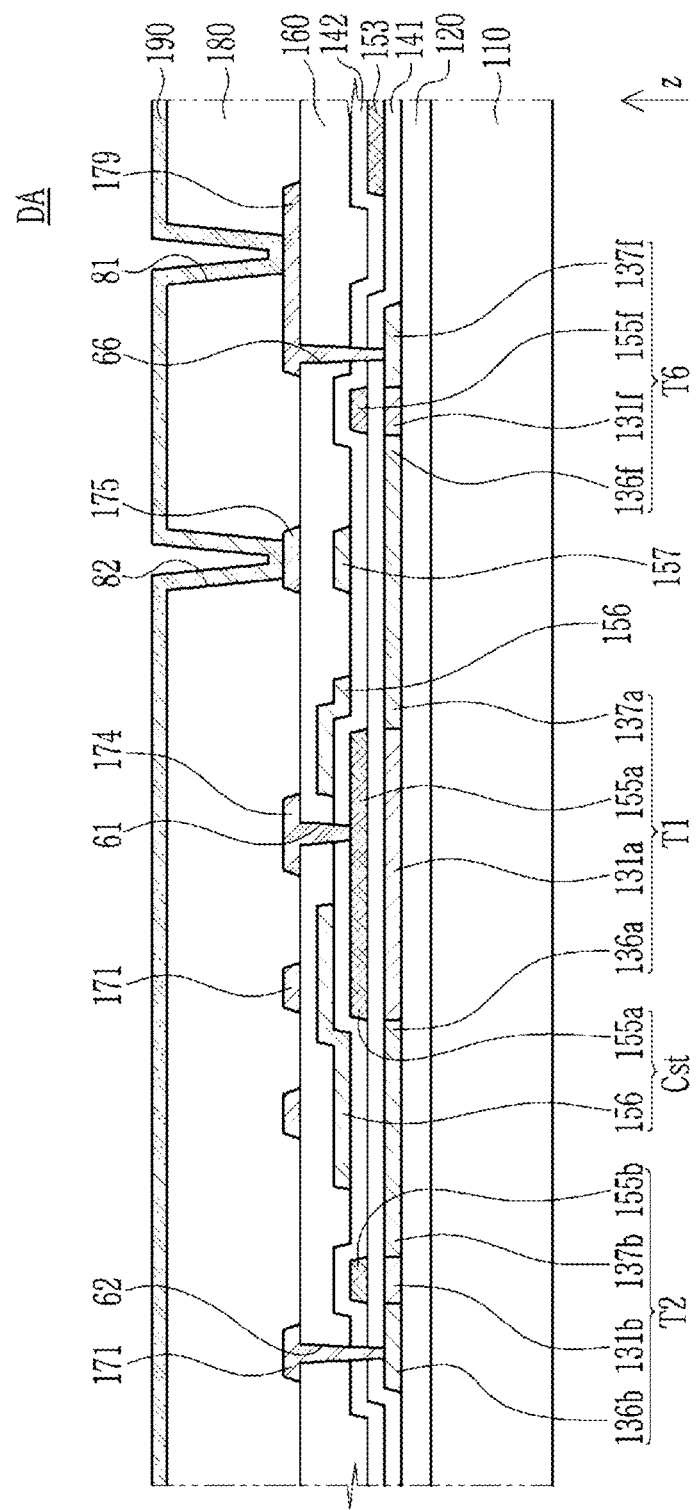
FIG. 7, FIG. 8, FIG. 9, FIG. 10, FIG. 11, and FIG. 12 illustrate cross-sectional views of structures formed in a manufacturing method of a display device according to an embodiment.
Figure 8:
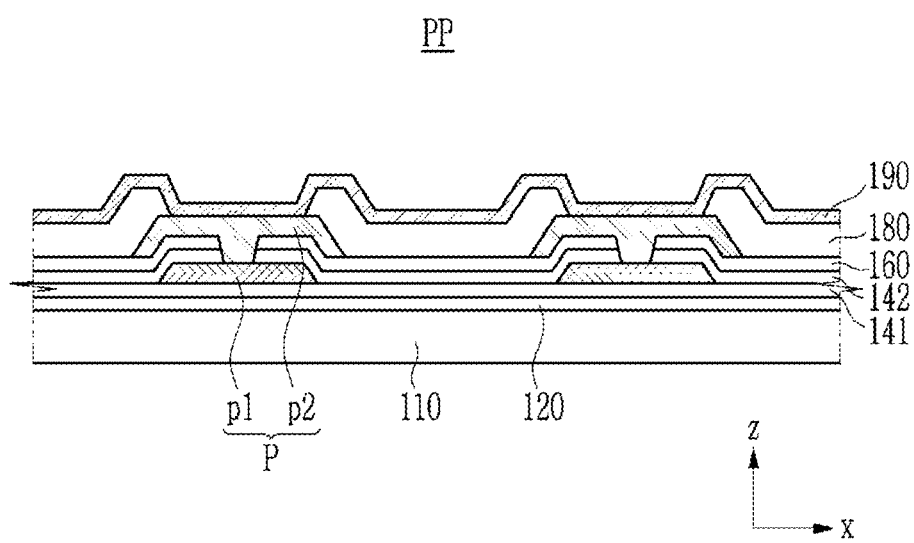
Figure 9:
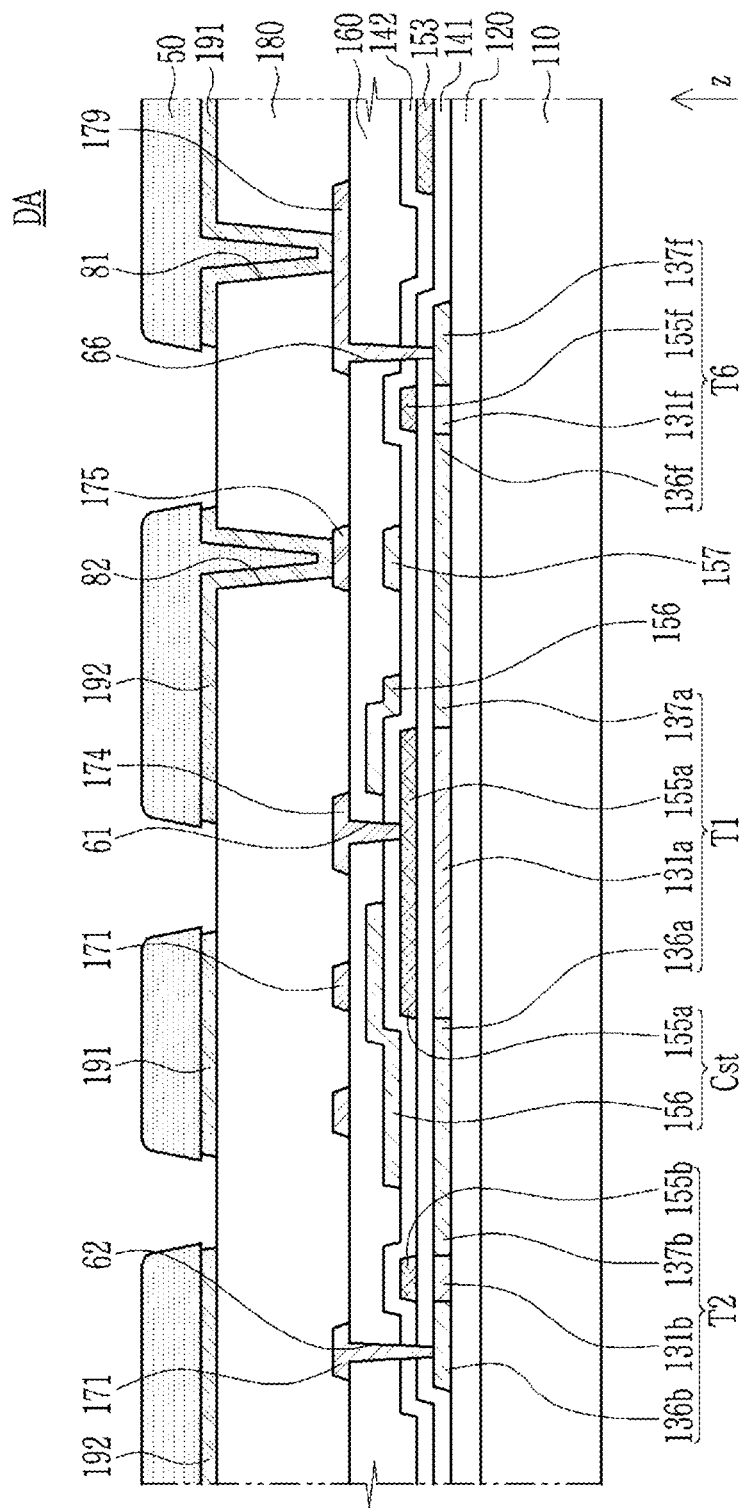
Figure 10:
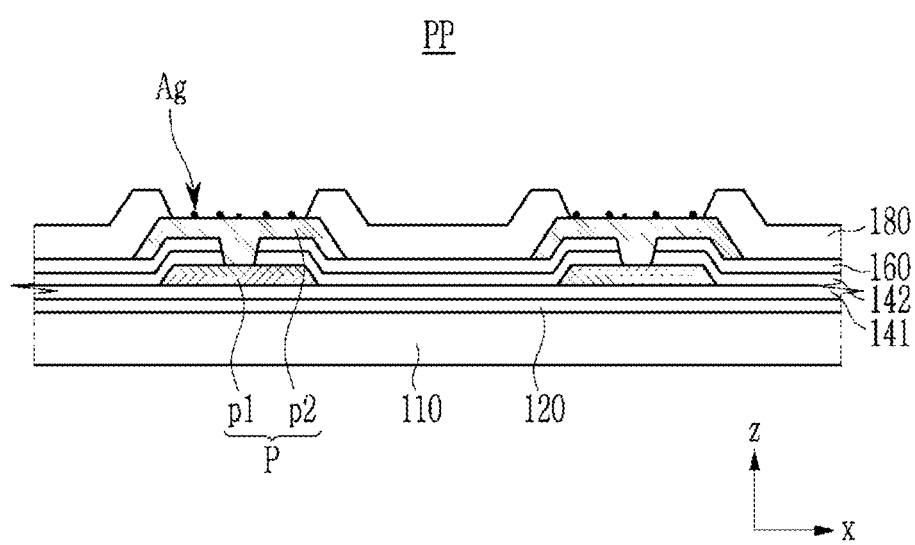
Figure 11:
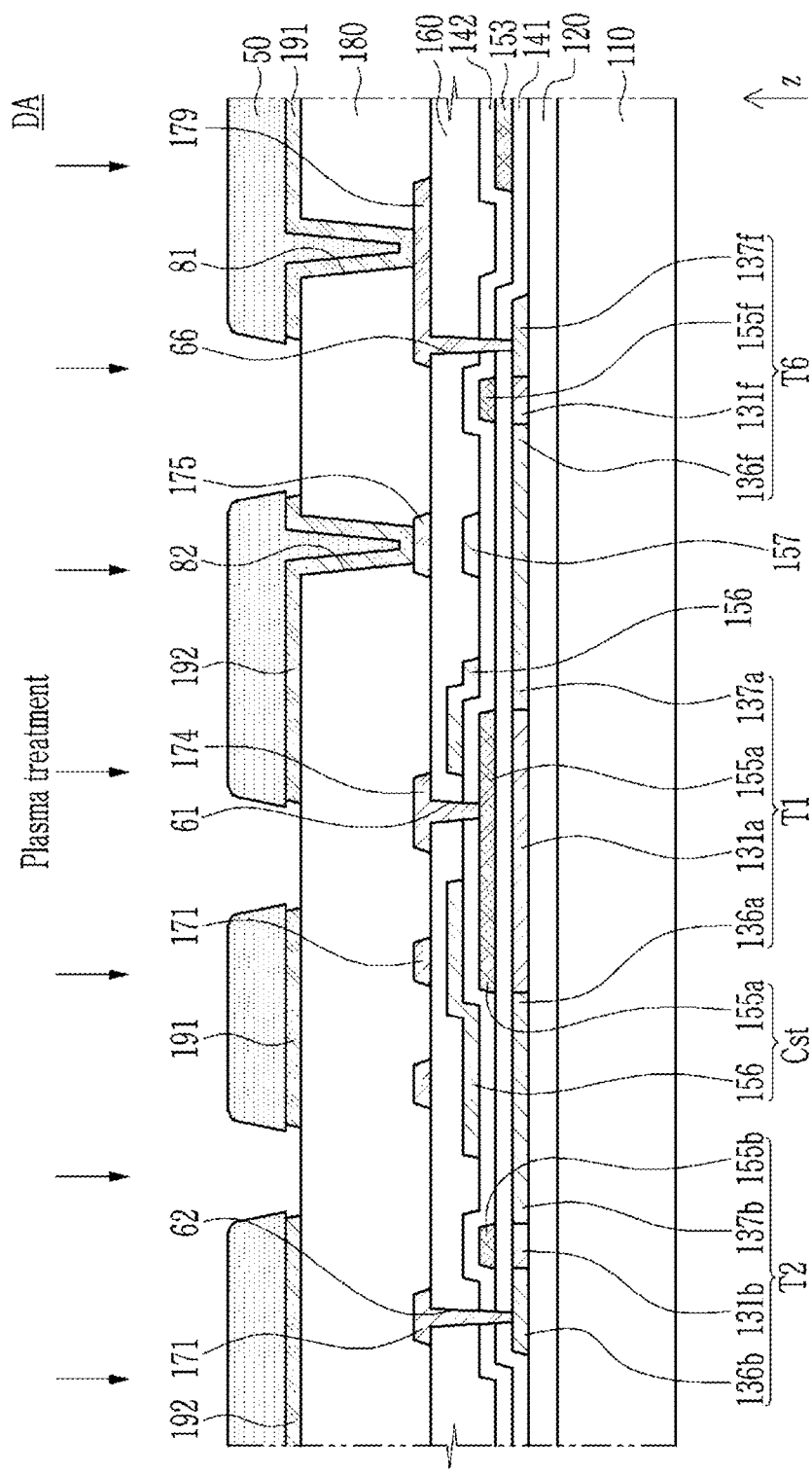

FIG. 4 illustrates an equivalent circuit diagram of one pixel of a display device according to an embodiment, FIG. 5 illustrates a layout view of pixels of a display device according to an embodiment, and FIG. 6 illustrates a cross-sectional view taken along line VI-VI' of FIG. 5 according to an embodiment. FIG. 7 to FIG. 12 illustrate cross-sectional views of structures formed in a manufacturing method of a display device according to an embodiment. FIG. 7, FIG. 9, and FIG. 11 correspond to the display area DA, and FIG. 8, FIG. 10, and FIG. 12 correspond to the pad portion PP.

Referring to FIG. 4, the pixel includes transistors T1, T2, T3, T4, T5, T6, and T7, a storage capacitor Cst, and an organic light emitting diode OLED connected to display signal lines 151, 152, 153, 158, 171, 172, and 192.

The transistors T1, T2, T3, T4, T5, T6, and T7 may include a driving transistor T1, a switching transistor T2, a compensation transistor T3, an initialization transistor T4, an operation control transistor T5, a light emission control transistor T6, and a bypass transistor T7.

The display signal lines 151, 152, 153, 158, 171, 172, and 192 may include a scan line 151, a previous scan line 152, a light emission control line 153, a bypass control line 158, a data line 171, a driving voltage line 172, and an initialization voltage line 192. The scan line 151 and the previous scan line 152 may be connected to a scan signal generating circuit of the aforementioned scan drivers SDa and SDb to respectively receive a scan signal Sn and a previous scan signal S(n−1), and the light emission control line 153 may be connected to a light emission control signal generating circuit of the aforementioned light emission drivers EDa and EDb to receive a light emission control signal EM.

The previous scan line 152 transmits the previous scan signal S(n−1) to the initialization transistor T4, the light emission control line 153 transmits the light emission control signal EM to the operation control transistor T5 and the light emission transistor T6, and the bypass control line 158 transmits the bypass signal BP to the bypass transistor T7.

The data line 171 may receive the data signal Dm outputted from the integrated circuit chip 20, and the driving voltage line 172 and the initialization voltage line 192 may respectively receive the driving voltage ELVDD and an initialization voltage VINT. The initialization voltage VINT initializes the driving transistor T1.

A gate electrode G1 of the driving transistor T1 is connected to a first electrode E1 of the storage capacitor Cst. A source electrode S1 of the driving transistor T1 is connected to the driving voltage line 172 via the operation control transistor T5. A drain electrode D1 of the driving transistor T1 is connected to an anode of the organic light emitting diode OLED via the light emission control transistor T6.

A gate electrode G2 of the switching transistor T2 is connected to the scan line 151. A source electrode S2 of the switching transistor T2 is connected to the data line 171. A drain electrode D2 of the switching transistor T2 is connected to the source electrode S1 of the driving transistor T1 and is connected to the driving voltage line 172 via the operation control transistor T5.

A gate electrode G3 of the compensation transistor T3 is connected to the scan line 151. A source electrode S3 of the compensation transistor T3 is connected to the drain electrode D1 of the driving transistor T1 and is connected to the anode of the organic light emitting diode OLED via the light emission control transistor T6. A drain electrode D3 of the compensation transistor T3 is connected to a drain electrode D4 of the initialization transistor T4, the first electrode E1 of the storage capacitor Cst, and the gate electrode G1 of the driving transistor T1 together.

A gate electrode G4 of the initialization transistor T4 is connected to the previous scan line 152. A source electrode S4 of the initialization transistor T4 is connected to the initialization voltage line 192. The drain electrode D4 of the initialization transistor T4 is connected to the first electrode E1 of the storage capacitor Cst and the gate electrode G1 of the driving transistor T1 together through the drain electrode D3 of the compensation transistor T3.

A gate electrode G5 of the operation control transistor T5 is connected to the light emission control line 153. A source electrode S5 of the operation control transistor T5 is connected to the driving voltage line 172. A drain electrode D5 of the operation control transistor T5 is connected to the source electrode S1 of the driving transistor T1 and the drain electrode D2 of the switching transistor T2.

A gate electrode G6 of the light emission control transistor T6 is connected to the light emission control line 153. A source electrode S6 of the light emission control transistor T6 is connected to the drain electrode D1 of the driving transistor T1 and the source electrode S3 of the compensation transistor T3. A drain electrode D6 of the light emission control transistor T6 is connected to the anode of the organic light emitting diode OLED.

A gate electrode G7 of the bypass transistor T7 is connected to the bypass control line 158. A source electrode S7 of the bypass transistor T7 is connected to the drain electrode D6 of the light emission control transistor T6 and the anode of the organic light emitting diode (OLED) together. A drain electrode D7 of the bypass transistor T7 is connected to the initialization voltage line 192 and the source electrode S4 of the initialization transistor T4 together.

A second electrode E2 of the storage capacitor Cst is connected to the driving voltage line 172. The cathode of the organic light emitting diode (OLED) is connected to a common voltage line 741 transmitting the common voltage ELVSS.

The circuit structure of the pixel PX is not limited to as shown in FIG. 4, and a number of the transistors, a number of the capacitors, and connections may be configured according to embodiments.

Referring to FIG. 5, as an example a pixel area including a red pixel R, a green pixel G, and a blue pixel B is shown. The display panel 10 may have the pixels R, G, and B repeatedly arranged.

The scan line 151, the previous scan line 152, the light emission control line 153, and the bypass control line 158 respectively transmitting the scan signal Sn, the previous scan signal Sn−1, the light emission control signal EM, and the bypass signal BP substantially extend in the first direction D1. The bypass control line 158 may be same as the previous scan line 152. The data line 171 and the driving voltage line 172 respectively transmitting the data signal Dm and the driving voltage ELVDD substantially extend in the second direction D2. The initialization voltage line 192 transmitting the initialization voltage Vint includes a part 192a substantially parallel to the first direction D1 and a part 192b that is oblique to the first direction D1, and the part 192a and the part 192b alternately extend.

The driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLED are formed at the positions shown in FIG. 5.

The organic light emitting diode OLED includes a first electrode 191, a light emission layer 370, and a second electrode 270. The compensation transistor T3 and the initialization transistor T4 may have a dual gate structure to prevent a leakage current.

Each channel of the driving transistor T1, the switching transistor T2, the compensation transistor T3, the initialization transistor T4, the operation control transistor T5, the light emission control transistor T6, and the bypass transistor T7 is disposed in one semiconductor 130. The semiconductor 130 may be bent to have one or more desirable shapes.

Referring to FIG. 5 and FIG. 6, the display panel 10 includes the substrate 110 and the layers formed thereon. The substrate 110 may be a flexible substrate made of a polymer such as polyimide, polyamide, polyethylene terephthalate, polycarbonate, etc. The substrate 110 may include a barrier layer for preventing diffusion of impurities that degrade semiconductor characteristics, and preventing penetration of moisture or the like. The substrate 110 may be a rigid substrate made of glass or the like.

The buffer layer 120 is disposed on the substrate 110. In a process of forming the semiconductor layer 130, the buffer layer 120 may serve to block impurities potentially diffusing from the substrate 110 into the semiconductor layer 130 and to reduce stress applied to the substrate 110. The buffer layer 120 may be formed by depositing an inorganic insulating material such as a silicon oxide, a silicon nitride, or the like.

The semiconductor layer 130 including a driving channel 131a, a switching channel 131b, a light emission control channel 131f, etc. is disposed on the buffer layer 120. The semiconductor layer 130 may be formed by depositing a semiconductor material and then patterning the semiconductor material. The semiconductor layer 130 may include a polycrystalline silicon, an oxide semiconductor, or amorphous silicon.

In the semiconductor 130, a driving source electrode 136a and a driving drain electrode 137a are formed on respective sides of the driving channel 131a, and a switching source electrode 136b and a switching drain electrode 137b are formed on respective sides of the switching channel 131b. In addition, a light emission control source electrode 136f and a light emission control drain electrode 137f are formed on respective sides of the light emission control channel 131f.

The first insulating layer 141 is disposed on the semiconductor layer 130. On the first insulating layer 141, a first gate conductor including a scan line 151 including a switching gate electrode 155b, a previous scan line 152, a light emission control line 153 including a light emission control gate electrode 155f, a bypass control line 158, and a driving gate electrode (first storage electrode) 155a is disposed. The first gate conductor may be formed by depositing one or more conductive layers and then patterning the one or more conductive layers.

The second insulating layer 142 is disposed on the first gate conductor and the first insulating layer 141. On the second insulating layer 142, a second gate conductor including a storage line 157 and a second storage electrode 156 as a part extended from the storage line 157 is positioned. The second storage electrode 156 forms the storage capacitor Cst along with the first storage electrode 155a. The second gate conductor may be formed by depositing one or more conductive layers and then patterning the one or more conductive layers.

The first and second gate conductors may include one or more metals such as one or more of molybdenum (Mo), copper (Cu), aluminum (Al), silver (Ag), chromium (Cr), tantalum (Ta), titanium (Ti), and metal alloys. The first and second insulating layers 141 and 142 may include an inorganic insulating material such as a silicon oxide, a silicon nitride, and the like. Referring to FIG. 2 and FIG. 3, the first conductor p1 of the pad P may be formed of the same material in the same process as the first gate conductor. When the first conductor p1 is disposed between the second insulating layer 142 and the third insulating layer 160, the first conductor p1 may be formed of the same material in the same process as the second gate conductor.

The third insulating layer 160 that may include an inorganic insulating material and/or an organic insulating material is disposed on the second insulating layer 142 and second gate conductor. The third insulating layer 160 has contact holes 61, 62, 63, 64, 65, 66, and 67.

On the third insulating layer 160, a data conductor including the data line 171, the driving voltage line 172, a driving connecting member 174, an initialization connecting member 175, and a pixel connecting member 179 is positioned. The data line 171 is connected to the switching source electrode 136b through the contact hole 62 formed in the insulating layers 141, 142, and 160. The driving connecting member 174 has one end connected to the first storage electrode 155*a* through the contact hole 61 formed in the insulating layers 142 and 160, and the other end connected to a compensation drain electrode and an initialization drain electrode through the contact hole 63 formed in the insulating layers 141, 142, and 160. The initialization connecting member 175 is connected to the initialization source electrode through the contact hole 64 formed in the insulating layers 141, 142, and 160. The pixel connecting member 179 is connected to the light emission control drain electrode 137*f* through the contact hole 66 formed in the insulating layers 141, 142, and 160.

The data conductor may include, for example, one or more metals such as one or more of copper (Cu), aluminum (Al), silver (Ag), molybdenum (Mo), chromium (Cr), gold (Au), platinum (Pt), palladium (Pd), tantalum (Ta), tungsten (W), titanium (Ti), nickel (Ni), and metal alloys. The data conductor may have a multi-layered structure, for example, a three-layered structure including a lower layer (auxiliary layer) for improving a contact characteristic and an upper layer (capping layer) for preventing oxidation and the like, with a main layer between the lower layer and the upper layer. The lower and upper layers may include, for example, one or more of titanium (Ti), chromium (Cr), molybdenum (Mo), tantalum (Ta), etc. The data conductor may be a multilayer such as titanium/aluminum/titanium (Ti/Al/Ti), titanium/copper/titanium (Ti/Cu/Ti), or molybdenum/aluminum/titanium (Mo/Al/Mo). The data conductor may be formed by depositing and patterning a conductive layer on the third insulating layer 160. Referring to FIG. 2 and FIG. 3, the second conductor p2 of the pad P may be formed of the same material in the same process as the data conductor.

The fourth insulating layer 180 (e.g., an organic insulating material layer) is disposed on the data conductor and the third insulating layer 160, and the first electrode 191 and the initialization voltage line 192 may be disposed on the fourth insulating layer 180. The pixel connecting member 179 is connected to the first electrode 191 through a contact hole 81 formed in the fourth insulating layer 180, and the initialization connecting member 175 is connected to the initialization voltage line 192 through a contact hole 82 formed in the fourth insulating layer 180.

Referring to FIG. 7 to FIG. 10, the first electrode 191 and the initialization voltage line 192 are formed by depositing a conductive layer 190 including silver (Ag) on the fourth insulating layer 180 and then patterning it. The conductive layer 190 may have multilayer structure such as ITO/silver (Ag)/ITO. The patterning of the conductive layer 190 may be performed by forming a photosensitive member 50 on the conductive layer 190 and by wet-etching the conductive layer 190 using the photosensitive member 50 as a mask. The photosensitive member 50 may cover an area of the conductive layer 190 in which the first electrode 191 and the initialization voltage line 192 are to be formed. Silver ions (Ag$^+$) may be generated by phosphoric acid (H$_3$PO$_4$) in an etchant when the conductive layer 190 is wet-etched. The silver particles may be deposited on the surface of the pad P due to the galvanic effect between the silver ions generated in the etchant and the pad P. If not properly treated and/or removed, the silver particles may grow by electromigration to undesirably short the pad P. The unwanted short circuit may cause interference in the driving/operation of the display panel, resulting in degraded reliability of the display device and/or defects such as a dark spot on a screen. Silver particles may be positioned in the pad portion PP and/or in the display area DA.

Figure 12:
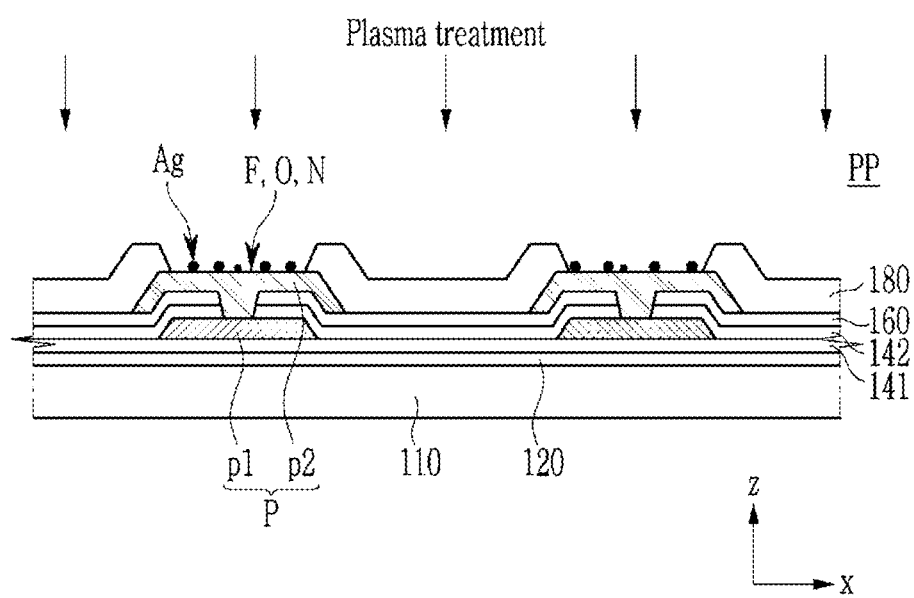

Referring to FIG. 11 and FIG. 12, in order to remove the precipitated silver particles, a plasma treatment is performed after etching of the conductive layer 190 (and/or after the first electrode has been substantially formed). Plasma etching (PE), reactive ion etching (RIE), and/or inductively coupled plasma (ICP) treatment may be used in the plasma treatment. The plasma treatment basically uses a halogen gas containing fluorine (F) or chlorine (Cl), and may use a mixed gas containing oxygen (O), nitrogen (N), or the like as needed. It may be advantageous to use a gas containing the fluorine (F) because the second conductor (p2) of the pad (P) may be damaged during plasma treatment performed by using a gas containing the chlorine in the halogen gas. For example, the plasma treatment may be performed by using a fluorine-containing gas such as a gas containing one or more of CF$_4$, C$_3$F$_6$, C$_4$F$_8$, SF$_6$, NF$_3$, CHF$_3$, C$_5$F$_8$, CHF$_3$, CH$_2$F$_2$, C$_2$HF$_5$, CH$_3$F, and the like; in an embodiment, the gas may contain CF$_4$. The gas used in the plasma treatment may further include N$_2$ and/or O$_2$. When the mixed gas includes CF$_4$, O$_2$, and N$_2$, a flow ratio of CF$_4$, O$_2$, and N$_2$ may be in a range of about 1:3:9 to 1:3:10; the flow ratio may depend on process conditions.

When the plasma treatment is performed using a gas containing a halogen, silver particles may react with the halogen to form a silver halide. For example, silver reacts with a fluorine radical to produce silver fluoride with high solubility in water.

$$Ag + F^* \rightarrow AgF(\text{water-soluble}, 1791 \text{ g/L})$$

The silver halide such as a silver fluoride or a silver chloride may swell more than silver particles and may dissolve in a cleaning liquid such as a stripper or deionized water (DI) to be easily removed. For example, silver have a density of 10.5 g/cm$^3$, but a silver fluoride has a density of 5.852 g/cm$^3$, which is about half the density of silver. Thus, the silver halide may be removed when the photosensitive member 50 is stripped or cleaned with the deionized water (DI).

Due to the plasma treatment, the metal on the surface of the second conductor p2 of the pad P may react with a radical to form a metal compound. For example, a metal fluoride, a metal oxide, and a metal nitride may be produced during the plasma treatment performed using a mixed gas including CF$_4$, O$_2$, and N$_2$. Therefore, fluorine, oxygen, and/or nitrogen may exist in the metal fluoride, the metal oxide, and/or the metal nitride on the surface of the second conductor p2. When the metal of the uppermost layer of the second conductor p2 is titanium, the surface of the second conductor p2 may include titanium fluoride, titanium oxide, and/or titanium nitride. The plasma treatment may be performed before or after the photosensitive member 50 is stripped.

Referring again to FIG. 5 and FIG. 6, an insulating layer 350 provided with an opening 351 exposing the first electrode 191 is disposed on the fourth insulating layer 180. The insulating layer 350 may be called a pixel defining layer. The insulating layer 350 may include an organic material such as at least one of a polyacrylate resin, a polyimide resin, and the like.

The emission layer 370 is disposed on the first electrode 191, and the second electrode 270 is disposed on the emission layer 370. The second electrode 270 may also be disposed on the insulating layer 350 and formed across the plurality of pixels.

The first electrode 191 may be referred to as a pixel electrode and may be an anode. The second electrode 270 may be referred to as a common electrode and may be a cathode. The first electrode 191 may include a metal such as one or more of silver (Ag), nickel (Ni), gold (Au), platinum (Pt), aluminum (Al), copper (Cu), molybdenum/aluminum neodymium (Mo/AlNd), and a metal alloy. The first electrode 191 may include a transparent conductive material such as indium tin oxide (ITO) and/or indium zinc oxide (IZO). For example, the first electrode 191 may have a multilayer structure such as ITO/silver (Ag)/ITO. The second electrode 270 may be formed by thinly laminating metals having low work functions such as at least one of calcium (Ca), barium (Ba), magnesium (Mg), aluminum (Al), silver (Ag), and the like to have a light transmitting property. The second electrode 270 may be formed of the transparent conductive material such as ITO and/or IZO. The first electrode 191, the emission layer 370, and the second electrode 270 of each pixel form a light-emitting element of an organic light emitting diode OLED.

An encapsulation layer 400 for protecting the organic light emitting diode OLED may be disposed on the second electrode 270, and a polarization layer for reducing reflection of external light may be positioned on the encapsulation layer 400. The encapsulation layer 400 may be a thin encapsulation layer including at least one inorganic material layer and at least one organic material layer.

Figure 13:
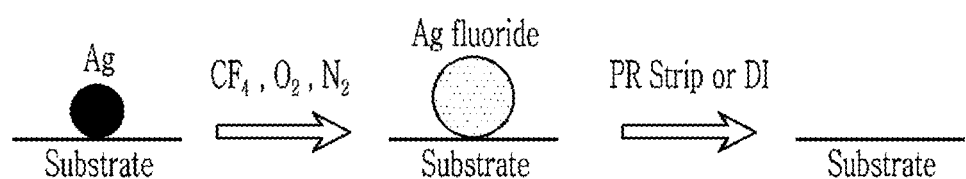
FIG. 13 illustrates a schematic diagram of a process of removing a silver particle.

Processes of generating and removing the silver particles in the manufacturing method of the display device are further described with reference to FIG. 13 together with FIG. 9 to FIG. 12. When the conductive layer 190 including silver is wet-etched to form the first electrode 191, silver particles (which are reductive particles due to the galvanic phenomenon) are precipitated on the pad P. Subsequently, when the plasma treatment is performed using a gas including $CF_4$, $O_2$, and $N_2$, the silver particles combine with fluorine to generate silver fluoride. The silver fluoride is in a more voluminous and more soluble state than the silver particles. Subsequently, when the photosensitive member 50 is stripped with the stripper and/or when it is cleaned with the deionized water (DI), the silver fluoride is dissolved and removed in the stripper and/or the deionized water (DI).

Results of several tests performed under different process conditions based on one or more embodiments are shown in Table 1 below.

reduction rate of the silver particles was in a range of about 15% to about 81% in the tests that plasma treatment was performed before the removing of the photosensitive member, and was in a range of about 2% to about 9% in the tests that plasma treatment was performed after the removing of the photosensitive member. The reduction rate of the silver particles as a result of performing plasma treatment before the removing of the photosensitive member was higher when the mixed gas included $CF_4$, $O_2$, and $N_2$ than when it included only $CF_4$ and $N_2$. Therefore, silver particles were effectively removed by performing plasma treatment with a mixed gas including $CF_4$, $O_2$, and $N_2$ before removal of the photosensitive member.

In the equipment modes for the plasma treatment, the plasma etching (PE) was more effective than the reactive ion etching (RIE), and the inductively coupled plasma (ICP) treatment was most effective.

Figure 14:
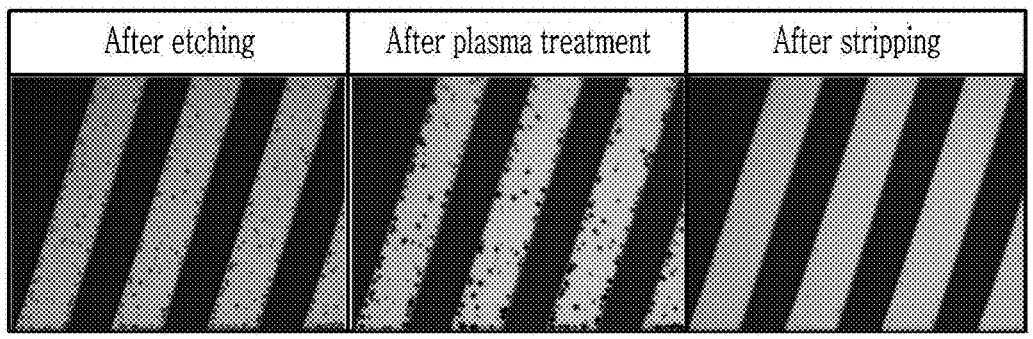
FIG. 14 and FIG. 15 are diagrams illustrating change of silver particles according to one or more embodiments.
Figure 15:
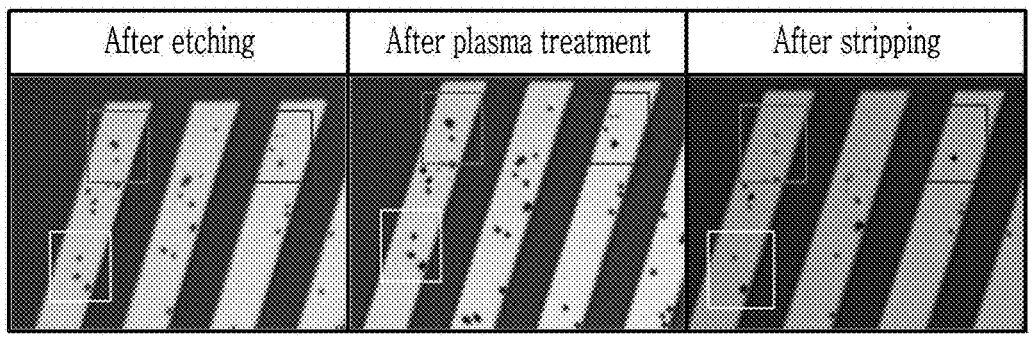

FIG. 14 and FIG. 15 illustrate the results of Test 2 and Test 6, respectively, of Table 1. Referring to FIG. 14 and FIG. 15, after the ITO/Ag/ITO conductive layer is wet-etched, silver particles are distributed on the surface of the pad. After the plasma treatment, the number of particles slightly decreased, and the mean size of the particles noticeably increased. After the stripping of the photosensitive member, the number of particles was considerably reduced. In Test 2, the number of particles decreased from 96 after the etching to 60 after the stripping, and in Test 6, the number of particles decreased from 343 after the etching to 66 after the stripping.

While example embodiments have been described, practical embodiments cover various modifications and equivalent arrangements within the scope of the appended claims.

What is claimed is:

1. A manufacturing method of a display device, the method comprising:
    forming a transistor on a substrate;
    forming an insulating layer on the transistor;
    forming a conductive layer including silver on the insulating layer;
    forming a photosensitive member on the conductive layer;
    forming an electrode of a light-emitting element by etching the conductive layer;

TABLE 1

| Test | Photosensitive film strip | Equipment mode | Gas | Pressure (mT) | RF power (W) | Gas amount (sccm) | Time (s) | Silver particle reduction |
|---|---|---|---|---|---|---|---|---|
| 1 | Before | PE | $CF_4/O_2/N_2$ | 250 | 250 | 30/90/280 | 60 | −27.2% |
| 2 |  | PE | $CF_4/O_2/N_2$ | 250 | 250 | 30/90/280 | 120 | −37.5% |
| 3 |  | PE | $CF_4/N_2$ | 250 | 250 | 40/360 | 60 | −9.4% |
| 4 |  | RIE | $CF_4/O_2/N_2$ | 50 | 500 | 20/60/140 | 60 | −25.0% |
| 5 |  | RIE | $CF_4/O_2/N_2$ | 50 | 500 | 20/60/140 | 120 | −15.2% |
| 6 |  | ICP | $CF_4/O_2/N_2$ | 150 | 500 | 30/90/280 | 120 | −81.0% |
| 7 | After | PE | $CF_4/O_2/N_2$ | 250 | 250 | 30/90/280 | 60 | −7.4% |
| 8 |  | PE | $CF_4/O_2/N_2$ | 250 | 250 | 30/90/280 | 120 | −2.3% |
| 9 |  | PE | $CF_4/N_2$ | 250 | 250 | 40/360 | 60 | −9.0% |
| 10 |  | RIE | $CF_4/O_2/N_2$ | 50 | 500 | 20/60/140 | 60 | −1.9% |
| 11 |  | RIE | $CF_4/O_2/N_2$ | 50 | 500 | 20/60/140 | 120 | −4.0% |

In the tests, the ITO/Ag/ITO conductive layer was wet-etched, then the plasma treatment was performed before or after stripping of the photosensitive member, and then the photosensitive member was stripped or washed. The same position was measured by a scope at each step to determine the number and size(s) of the silver particles. A glass substrate of 370 mm×470 mm was used as the substrate. A performing plasma treatment on a structure that comprises the electrode, the plasma treatment using a gas including a halogen; and removing a product that results from the plasma treatment, wherein etching the conductive layer produces silver particles, wherein the product is a silver halide, and wherein performing the plasma treatment produces the silver halide from the silver particles.

2. The method of claim 1 wherein the silver halide is a silver fluoride.

3. The method of claim 1, wherein the plasma treatment is performed using a gas including fluorine.

4. The method of claim 3, wherein the gas includes at least one of $CF_4$, $C_3F_6$, $C_4F_8$, $SF_6$, $NF_3$, $CHF_3$, $C_5F_8$, $CHF_3$, $CH_2F_2$, $C_2HF_5$, and $CH_3F$.

5. The method of claim 1, wherein the plasma treatment is performed using a gas including $CF_4$.

6. The method of claim 5, wherein the plasma treatment is performed using a gas including $N_2$.

7. The method of claim 6, wherein the plasma treatment is performed using a gas including $O_2$.

8. The method of claim 1, wherein the plasma treatment includes at least one of plasma etching, reactive ion etching, and inductively coupled plasma treatment.

9. The method of claim 1, wherein the plasma treatment is performed by inductively coupled plasma.

10. The method of claim 1, wherein the plasma treatment is performed before removing the photosensitive member.

11. The method of claim 10, further comprising removing the photosensitive member using a stripper in a process step after the plasma treatment, wherein the product is removed in the process step.

12. The method of claim 1, wherein the product is removed using a cleaning liquid.

13. The method of claim 1, further comprising forming an electrically conductive pad on the substrate when the transistor is formed, wherein after the removing of the product, a surface of the pad includes a metal fluoride.

* * * * *